United States Patent
Hsiao et al.

[11] Patent Number: 6,142,810
[45] Date of Patent: Nov. 7, 2000

[54] ZIF SOCKET TERMINAL

[75] Inventors: Shih-Wei Hsiao, Tu-Chen; Yao-Chi Huang, Yung-Ho, both of Taiwan

[73] Assignee: Hon Hai Precision Ind. Co., Ltd., Taipei Hsien, Taiwan

[21] Appl. No.: 09/375,600

[22] Filed: Aug. 17, 1999

[30] Foreign Application Priority Data

Mar. 2, 1999 [TW] Taiwan .................................. 88203138

[51] Int. Cl.⁷ .................................................. H01R 13/625
[52] U.S. Cl. ........................... 439/342; 439/857; 439/246
[58] Field of Search .................................... 439/342, 856, 439/857, 246, 83

[56] References Cited

U.S. PATENT DOCUMENTS

| | | | |
|---|---|---|---|
| 4,498,725 | 2/1985 | Bright et al. | 439/857 |
| 5,188,535 | 2/1993 | Bertho et al. | 439/857 |
| 5,324,215 | 6/1994 | Walkup et al. | 439/857 |
| 5,409,406 | 4/1995 | McClure | 439/857 |
| 5,618,187 | 4/1997 | Goto | 439/857 |
| 5,649,836 | 7/1997 | Kashiwagi | 439/342 |

*Primary Examiner*—Gary F. Paumen
*Attorney, Agent, or Firm*—Wei Te Chung

[57] ABSTRACT

A ZIF socket of the present invention comprises a base, a cover slidably mounted on the base, a number of terminals received in the base and a cam mechanism arranged between the base and the cover for driving the cover to move along the base in one direction. Each terminal comprises an engaging portion, a retention portion, a neck interconnecting the engaging and retention portions and a mounting pad. The engaging portion comprises a pair of cantilevers symmetrically extending a predetermined distance from the neck in one direction and converging toward each other. The neck is flexible enough so that the engaging portion rotates with respect to the neck whereby the pair of cantilevers is reliably connected with a contact tail of an electronic package even when the contact tail is incorrectly positioned in the aperture.

2 Claims, 8 Drawing Sheets

ZIF SOCKET TERMINAL

BACKGROUND OF THE INVENTION

The present invention relates to a zero insertion force (ZIF) socket, and particularly to a socket having a plurality of terminals whose engaging portions are adjustable to adapt for malposition of CPU pins.

DESCRIPTION OF THE PRIOR ART

U.S. Pat. Nos. 3,676,832; 4,498,725 and 4,988,310 disclose ZIF sockets. Referring to FIG. 1, a conventional ZIF socket 6 comprises a base 601, a cover 602 slidably mounted on the base 601, a plurality of contacts 60 received in the base 601 and a cam mechanism 603 arranged between the base 601 and the cover 602 for driving the cover 602 to move along the base 601 in one direction.

Referring to FIG. 2, the contact 60 comprises a retention portion 61, a mating portion 62 and a connecting portion 63 joining the retention portion 61 and the mating portion 62 together. The retention portion 61 forms a plurality of barbs 611 for engaging with corresponding apertures of the base 601 and a mounting pad 64 on opposite edges thereof for being electrically connected to a printed circuit board (not shown). The mating portion 62 comprises a first arm 621 and a second arm 623 extending from the connecting portion 63 in opposite directions. The second arm 623 is generally parallel to the retention portion 61. The first arm 621 is much longer than the second arm 623. The first arm 621 is arcuate and forms a U-shaped cantilever together with the second arm 623. The arms 621, 623 converge toward each other at free ends 622 thereof.

Referring to FIG. 3, when the cover 602 is located at an opened position, a contact tail 7 of an electronic package mounted on the cover 602 is received in the mating portion 62 without making contact therewith. When the cover 602 is driven to a closed position by the cam mechanism 603, the contact tail 7 is moved and positioned between the free ends 622 of the first and second arms 621, 623 and is electrically connected therewith.

However, because the first and second arms 621, 623 have different lengths, each has a different electrical resistance resulting in unbalanced signal transfer between the first and second arms 621, 623.

Referring to FIG. 4, the connecting portion 63 of the contact 60 has a rigidity and is not flexible which results in the mating portion 62 being totally unmovable in accordance with the retention portion 61. Thus, when the electronic package is incorrectly mounted on the ZIF socket 6, the mating portion 62 is not adjustable to adapt for a malposition of the contact tail 7 and the contact tail 7 might only contact one arm of the mating portion 62 toward which the contact tail 7 deflects and is unconnected with the other arm from which the contact tail 7 is apart. As a result, electrical resistance of the contact 60 is too high to generate a delayed signal transfer. Hence, an improved ZIF socket is required to overcome the disadvantages of the prior art.

BRIEF SUMMARY OF THE INVENTION

An object of the present invention is to provide a ZIF socket having terminals reliably connected to contact tails of an electronic package wherein electrical resistance between the contact tails and the terminals is low.

An ZIF socket of the present invention comprises a base, a cover slidably mounted on the base, a plurality of terminals received in the base and a cam mechanism arranged between the base and the cover for driving the cover to move along the base in one direction. Each terminal comprises an engaging portion, a retention portion, a neck for joining the engaging and retention portions together and a mounting pad. The engaging portion comprises a pair of cantilevers symmetrically extending a predetermined distance from the neck in one direction and converging toward each other. The neck is flexible enough so that the engaging portion rotates with respect to the neck when a contact tail of an electronic package mating to the ZIF socket is incorrectly disposed between the pair of cantilevers whereby the pair of cantilevers are reliably connected with a contact tail of an electronic package even when the contact tail is deflectively positioned in the terminal.

Other objects, advantages and novel features of the invention will become more apparent from the following detailed description of the present embodiment when taken in conjunction with the accompanying drawings.

DETAILED DESCRIPTION OF THE INVENTION

Figure 1:
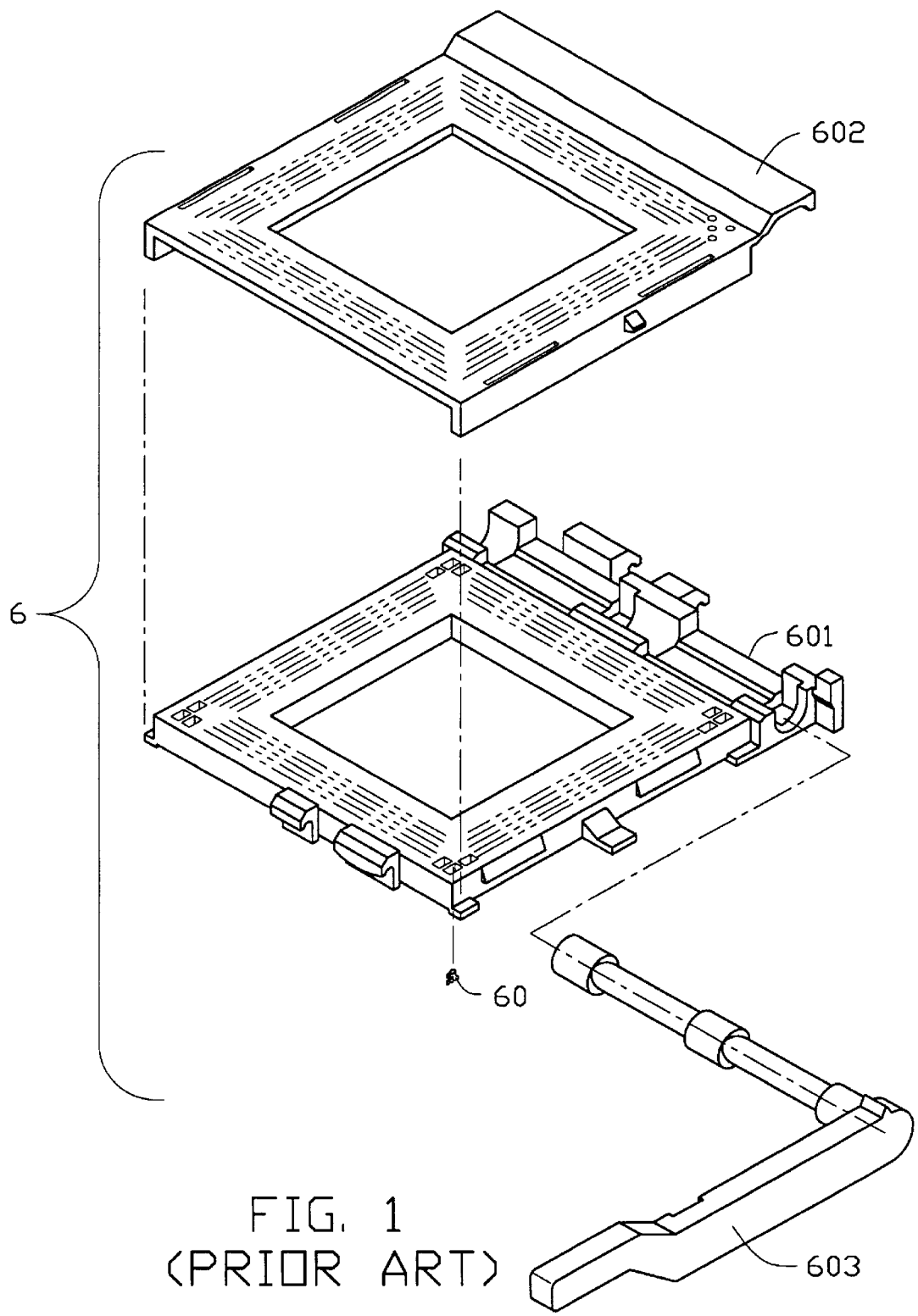
FIG. 1 is an exploded view of a ZIF socket of the prior art.
Figure 2:
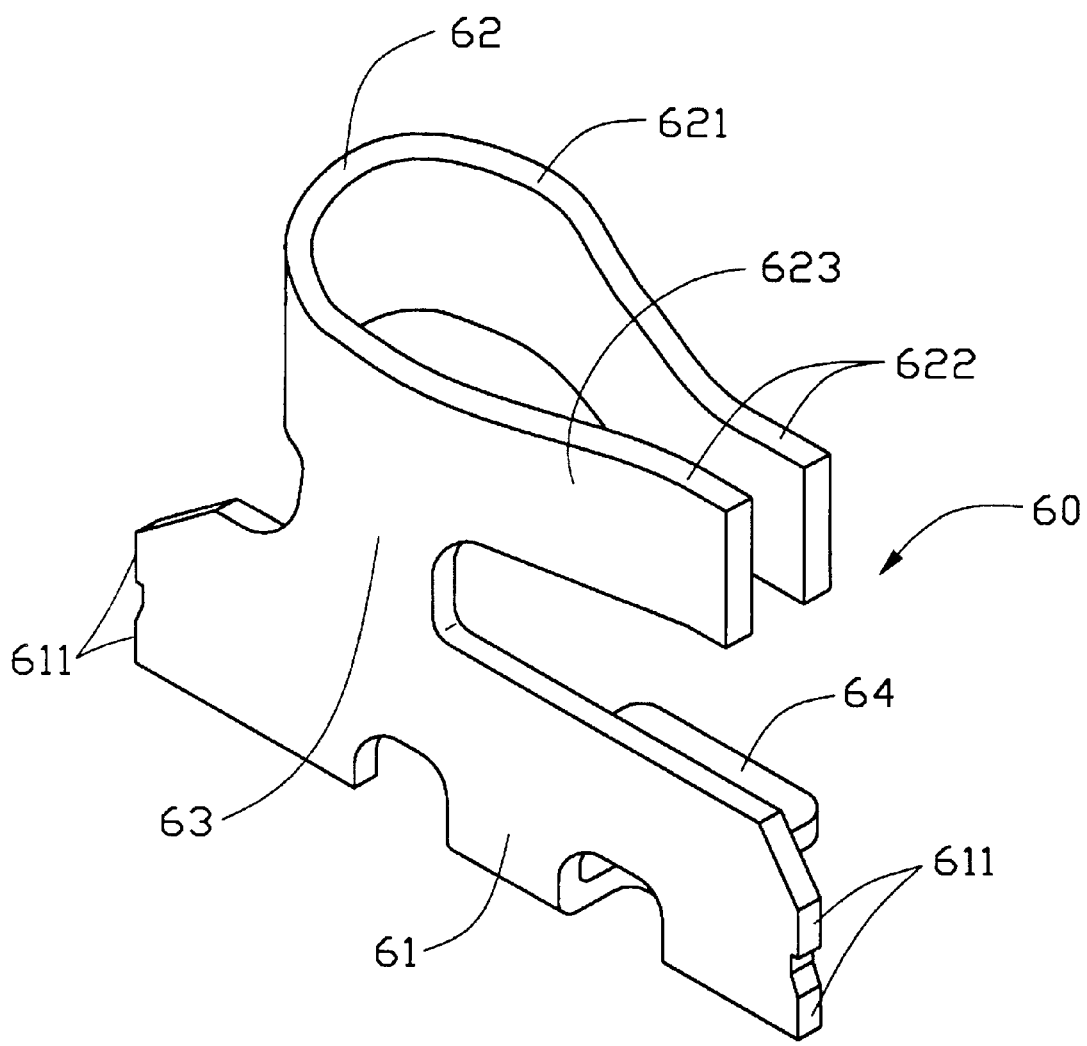
FIG. 2 is a perspective view of a terminal of FIG. 1.
Figure 3:
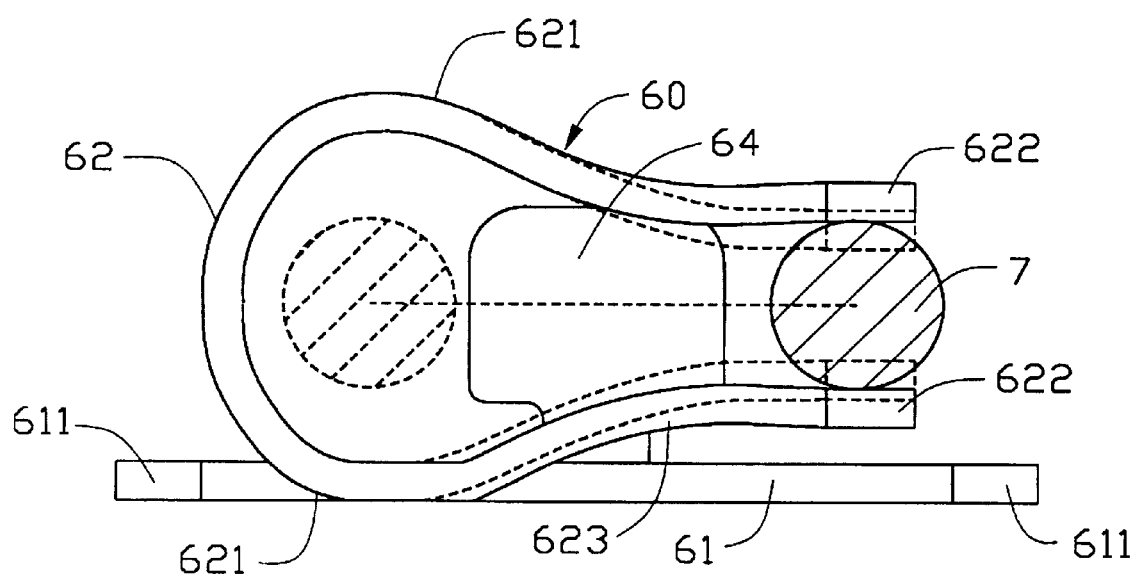
FIG. 3 is a top planar view of the terminal of FIG. 1 illustrating a contact tail of an electronic package moving from a disconnected position to a connected position.
Figure 4:
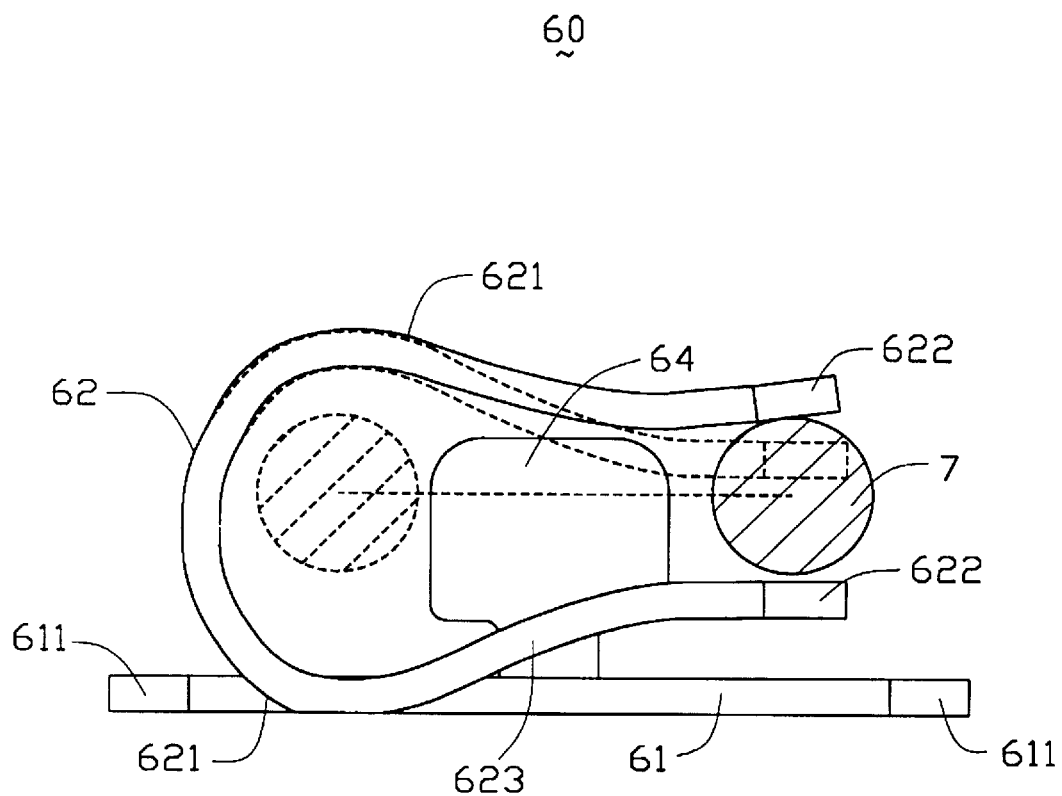
FIG. 4 is similar to FIG. 3 but the contact tail is at a deflected position.
Figure 5:
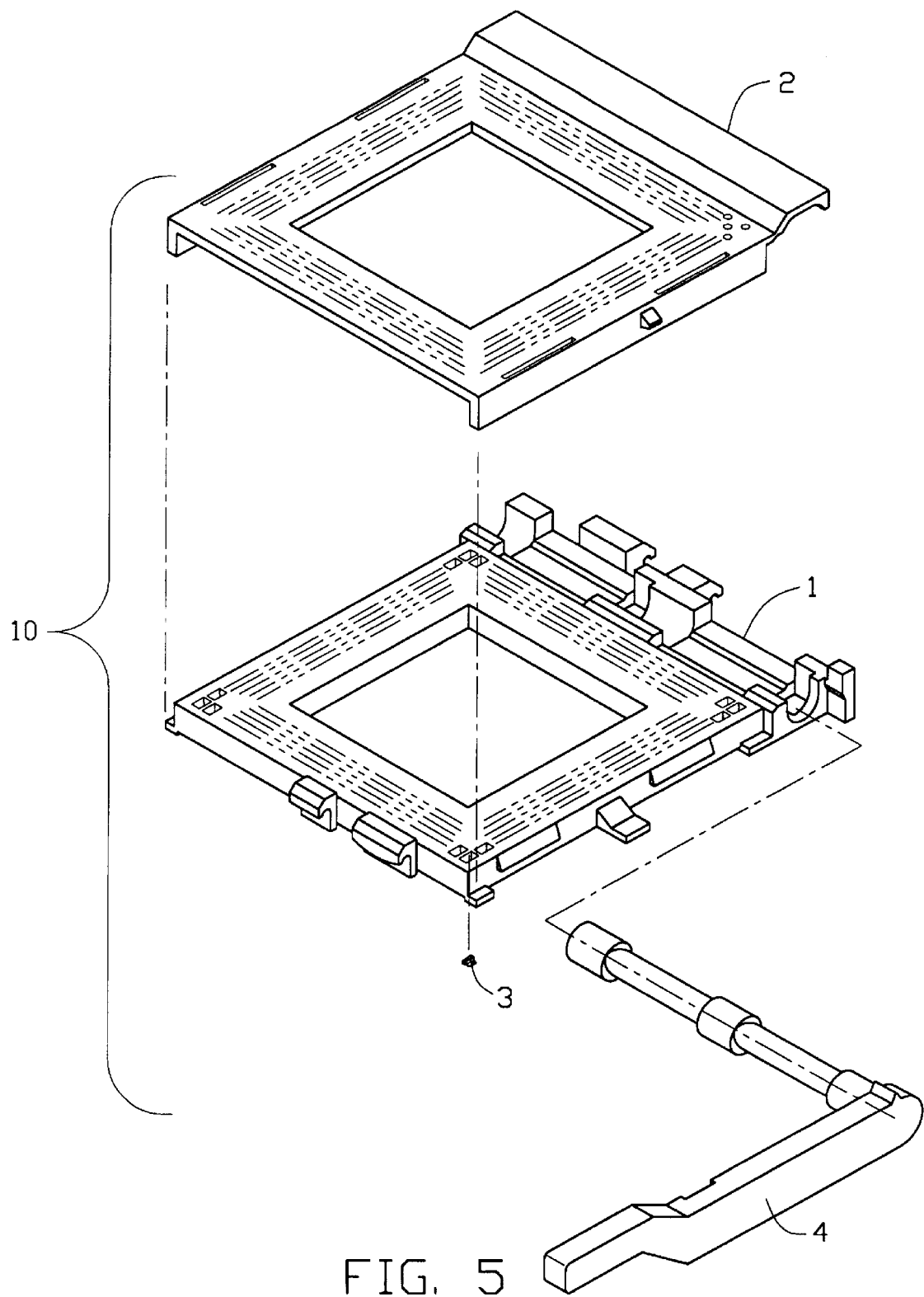
FIG. 5 is an exploded view of a ZIF socket of the present invention.

Referring to FIG. 5, a ZIF socket 10 in accordance with the present invention comprises a base 1, a cover 2 slidably mounted on the base 1, a plurality of terminals 3 received in the base 1 and a cam mechanism 4 arranged between the base 1 and the cover 2 for driving the cover 2 to move along the base 1 in one direction. The base 1 is mounted on a printed circuit board (not shown) and an electronic package (not shown) is positioned on the cover 2. The printed circuit board and the electronic package are electrically connected via the plurality of terminals 3.

Figure 6:
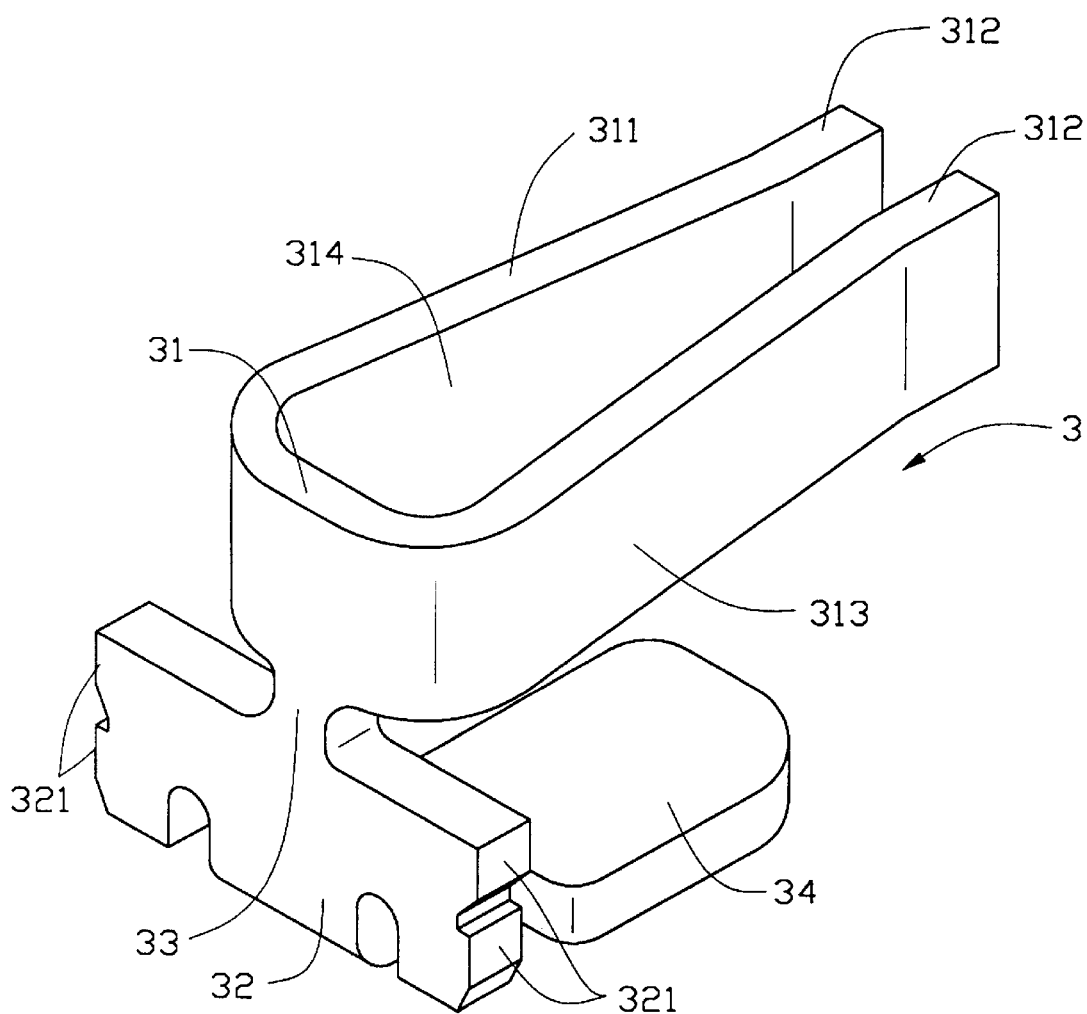
FIG. 6 is a perspective view of a terminal of FIG. 5.

Referring to FIG. 6, each terminal 3 comprises an engaging portion 31, a retention portion 32, a neck 33 and a mounting pad 34. The engaging portion 31 comprises a pair of cantilevers 311 which extends a predetermined distance in one direction and converges toward each other. The engaging portion 31 is symmetrically arranged about a central line "A" thereof. Each cantilever 311 has a free end 312 and a connecting arm 313. A space 314 is defined between the two cantilevers 311. The distance between the free ends 312 is smaller than the dimension of a contact tail 5 (FIG. 7) of the electronic package, and the distance between the connecting arms 313 is greater than the dimension of the contact tail 5. The retention portion 32 is rectangular and perpendicular to the central line "A" of the engaging portion 31. The retention portion 32 forms barbs 313 on opposite edges thereof for reliably retaining the terminal 3 in the base 1. The neck 33 is configured to join the engaging portion 31 and the retention portion 32 together. The neck 33 extends from the engaging portion at the junction between the two cantilevers 311, thus the engaging portion 31 is symmetrical about the neck 33. The mounting pad 34 perpendicularly extends from the retention portion 32.

Figure 7:
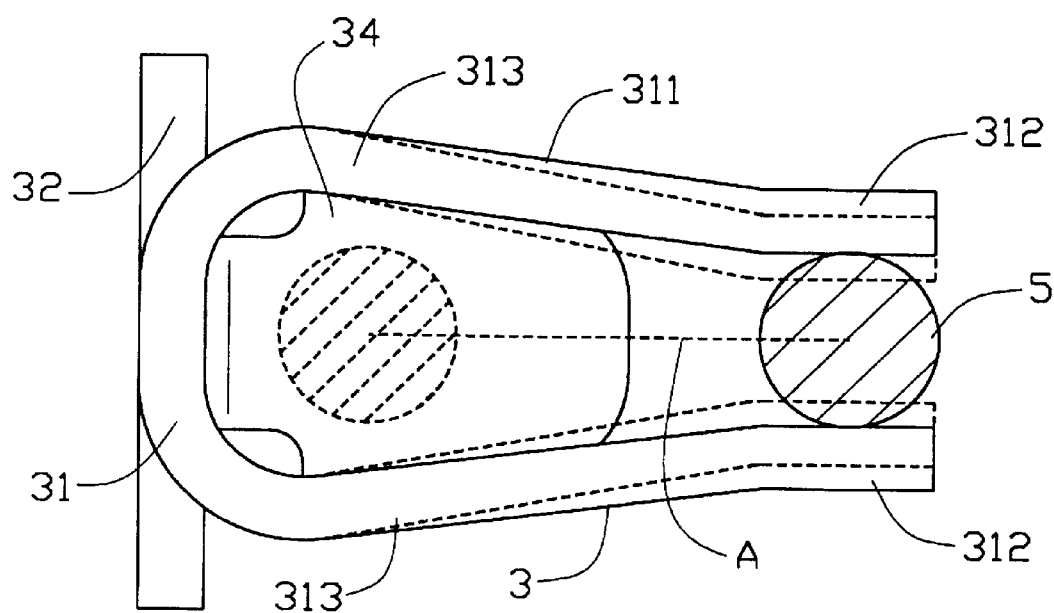
FIG. 7 is a top planar view of the terminal of FIG. 5 illustrating the contact tail of the electronic package moving from a disconnected position to a connected position.

Referring to FIG. 7, when the electronic package is assembled on the ZIF socket 10, the cover 2 is located at an opened state, and each contact tail 5 positioned between the corresponding pair of connecting arms 313 without making contact therewith, thus the insertion force is zero. Rotating a handle of the cam mechanism 4 (FIG. 5) causes the cover 2 together with the electronic package to move along the base 1 in one direction to a closed position. The contact tail 5 moves towards the free ends 312 of the cantilevers 311 which securely engage the contact tail 5 since the gap between the two free ends 312 is smaller than the outer diameter of the contact tail 5.

Figure 8:
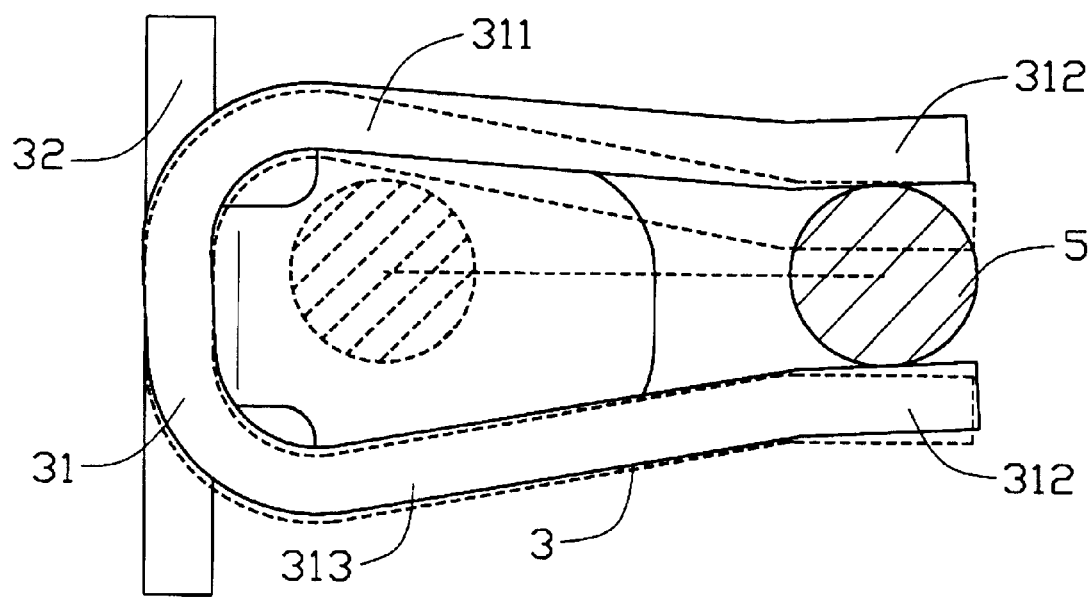
FIG. 8 is similar to FIG. 7 but the contact tail is at a deflected position.

Referring to FIG. 8, when the contact tail 5 is deflectively received in the terminal 3, the contact tail 5 first abuts against one of the cantilevers 311 but does not contact the other cantilever 311. Since the contact tail 5 continuously moves toward the free ends 312, the contact tail 5 pushes one of the cantilevers 311 thereby causing the engaging portion 31 to rotate around the neck 33 due to the flexibility thereof. The free end 312 of the other cantilever 311 moves toward the contact tail 5 to make contact therewith and establish reliable electrical connection therebetween.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for electrically connecting an electronic package having a plurality of contact tails to a printed circuit board, the connector comprising:

a base having a plurality of apertures;

a cover slidably mounted on the base and defining a plurality of cavities aligned with the apertures of the base, the cover being adapted to carry the electronic package with the contact tails of the electronic package extending through corresponding cavities of the cover into corresponding apertures of the base; and a plurality of terminals received in the apertures of the base, each terminal comprising an engaging portion having a pair of identical cantilevers, a retention portion secured in corresponding aperture of the base and a neck interconnected between the engaging portion and the retention portion, the cantilevers converging to each other at free ends thereof and spaced from each other by a gap smaller than a diameter of the contact tail, the neck being sufficiently flexible to permit the engaging portion to rotate a predetermined angle relative to the retention portion to establish a reliable engagement between each cantilever and the contact tail when the contact tail deflects toward one of the cantilevers;

wherein the engaging portion is symmetrical about a central line of the engaging portion and the neck is positioned on the central line;

wherein the neck is perpendicular to the central line of the engaging portion;

wherein the retention portion of the terminal is perpendicular to the central line of the engaging portion;

wherein each terminal comprises a mounting pad laterally extending from the retention portion, the mounting pad being parallel to the central line of the engaging portion.

2. A terminal for use with a socket for electrically connecting with a contact tail of an electronic package, comprising:

an engaging portion having a pair of identical cantilevers, each cantilever having a free end gradually approaching to the other to define a gap therebetween smaller than an outer diameter of the contact tail;

a retention portion; and a neck interconnected between the engaging portion and the retention portion, the neck being flexible enough to permit a pivotal movement of the engaging portion with respect to the retention portion to establish a reliable engagement between each cantilever and the contact tail;

wherein the engaging portion is symmetrical about a central line of the engaging portion and the neck is positioned on the central line;

wherein the neck is perpendicular to the central line of the engaging portion;

wherein the retention portion of the terminal is perpendicular to the central line of the engaging portion;

wherein each terminal comprises a mounting pad laterally extending from the retention portion, the mounting pad being parallel to the central line of the engaging portion.

* * * * *